(12) United States Patent
Muhammad et al.

(10) Patent No.: US 8,922,260 B2
(45) Date of Patent: Dec. 30, 2014

(54) METHOD AND APPARATUS FOR A PROGRAMMABLE FREQUENCY DIVIDER

(71) Applicant: MStar Semiconductor, Inc., Chupei, Hsinchu County (TW)

(72) Inventors: Khurram Muhammad, Garland, TX (US); Chih-Ming Hung, HsinChu (TW)

(73) Assignee: MStar Semiconductor, Inc., Hsinchu (TW)

( * ) Notice: Subject to any disclaimer, the term of this patent is extended or adjusted under 35 U.S.C. 154(b) by 19 days.

(21) Appl. No.: 13/875,706

(22) Filed: May 2, 2013

(65) Prior Publication Data

US 2014/0327473 A1    Nov. 6, 2014

(51) Int. Cl.
*H03B 19/00*    (2006.01)
*H03K 3/012*    (2006.01)

(52) U.S. Cl.
CPC ..................................... *H03K 3/012* (2013.01)
USPC ............ 327/117; 327/115; 327/116; 327/122

(58) Field of Classification Search
USPC ......... 327/115, 116, 117, 118, 355–361, 202, 327/203, 208–212, 218; 377/47, 48
See application file for complete search history.

(56) References Cited

U.S. PATENT DOCUMENTS

| 4,965,531 | A | * | 10/1990 | Riley | 331/1 A |
| 5,764,087 | A | * | 6/1998 | Clark | 327/105 |
| 6,822,488 | B1 | * | 11/2004 | Riley | 327/107 |
| 7,778,371 | B2 | * | 8/2010 | Do et al. | 375/371 |
| 7,969,251 | B2 | * | 6/2011 | Fu et al. | 331/74 |
| 2002/0121938 | A1 | * | 9/2002 | Fan | 331/16 |
| 2003/0219091 | A1 | * | 11/2003 | Riley | 377/47 |
| 2008/0024240 | A1 | * | 1/2008 | Wang | 332/127 |
| 2009/0201066 | A1 | * | 8/2009 | Do et al. | 327/299 |
| 2012/0013406 | A1 | * | 1/2012 | Zhu et al. | 331/34 |

\* cited by examiner

*Primary Examiner* — Brandon S Cole
(74) *Attorney, Agent, or Firm* — Oliff PLC

(57) ABSTRACT

A dual-edge triggered variable frequency divider for use in digital frequency synthesis is disclosed. The variable frequency divider utilizes a multiphase clock and a logic unit, including both positive and negative edge triggered unit delay elements connected in parallel. The variable frequency divider generates a clock pulse from a signal source that corresponds to an input value from a logic unit, generates a next input value by the logic unit based on the input value and a frequency control word, and transmits the next input value from the logic unit to the signal source in response to the clock pulse. The multiphase clock is configured to generate the clock signal in response to the falling edge of the first pulse of the clock signal. Iteratively selecting signals by this process results in an observed output frequency of $f_{out}=N*f_{src}/D$, where $f_{src}$ is the input signal frequency, N is the number of phases of the multi-phase (N-phase) clock, and D is an integer between 1 and N configured by the frequency control word.

15 Claims, 8 Drawing Sheets

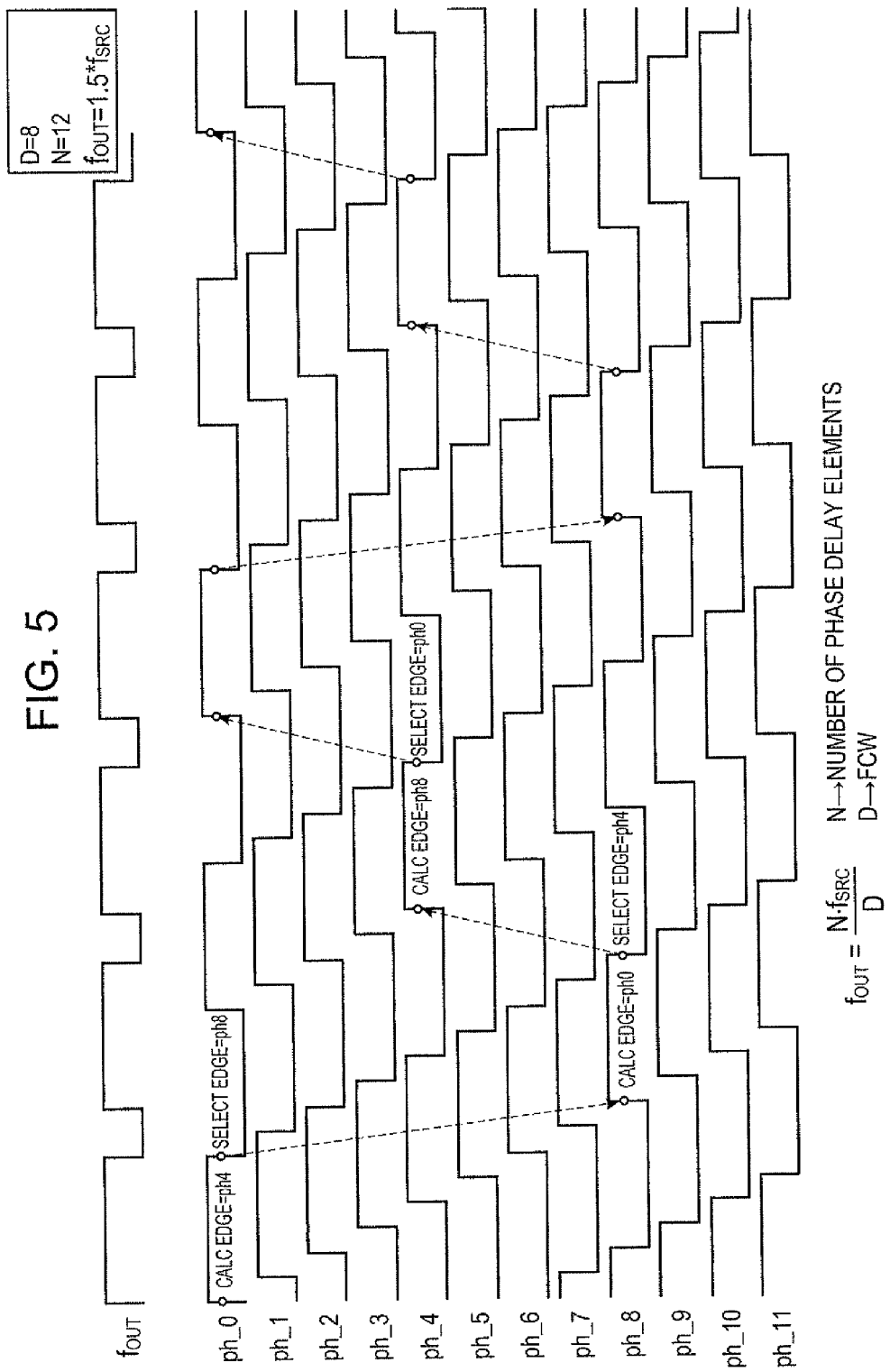

METHOD AND APPARATUS FOR A PROGRAMMABLE FREQUENCY DIVIDER

BACKGROUND

Variable digital frequency division is the driving technology behind digital frequency synthesis. A variable frequency divider appears to synthesize a broad range of output frequencies from an input frequency $f_{in}$, according to the basic relationship $f_{out}=A*f_{in}/B$, where A is some fixed integer and B is some configurable integer. A variable frequency divider achieves this functionality by appropriately selecting signals from a multi-phase (or N-phase) clock in rapid succession. The particular signal sequence and frequency of selection each contribute to the observed overall output clock frequency $f_{out}$. Some advantages of variable digital frequency dividers are low power consumption, high efficiency, and low phase noise.

SUMMARY

Aspects of the invention can provide a low power, high efficiency, low phase noise variable digital frequency divider capable of generating a clock pulse by a signal source corresponding to an input value from a logic unit, generating a next input value by the logic unit based on the input value and a frequency control word, and transmitting the next input value from the logic unit to the signal source in response to the clock pulse. More specifically, this translates to providing a variable frequency divider capable of performing two operations during a single clock pulse of a given signal: a first operation performed on the rising edge of the pulse, which calculates the address of a signal to be subsequently applied to the variable frequency divider, and a second operation performed in response to the falling edge of the pulse, which selects the next signal from the multi-phase (N-phase) clock. This selection is made based on the frequency control word and a previously selected signal.

Further aspects can provide a variable digital frequency divider with an input/output frequency relationship satisfying $f_{out}=N*f_{src}/D$, where N is the degree (number of selectable signals available) from the N-phase signal source, D is an integer between 1 and N, the value of which is represented by a frequency control word (and also provided as an input to the variable digital frequency divider), and $f_{src}$ is the input source frequency.

A preferred application of the variable digital frequency divider disclosed herein may be as the central synthesis component of a digital frequency synthesizer with added emphasis on a low phase-noise frequency generation component (referred to in this document as the "source frequency" signal).

BRIEF DESCRIPTION OF THE DRAWINGS

Various embodiments of the disclosure that are proposed as examples will be described in detail with reference to the following figures, wherein like numerals reference like elements, and wherein:

FIG. 5 shows a diagram of an exemplary process of signal selection and output from a variable frequency divider 100 with a 50% duty cycle according to an embodiment of the disclosure;

DETAILED DESCRIPTION OF THE EMBODIMENTS

Figure 1:
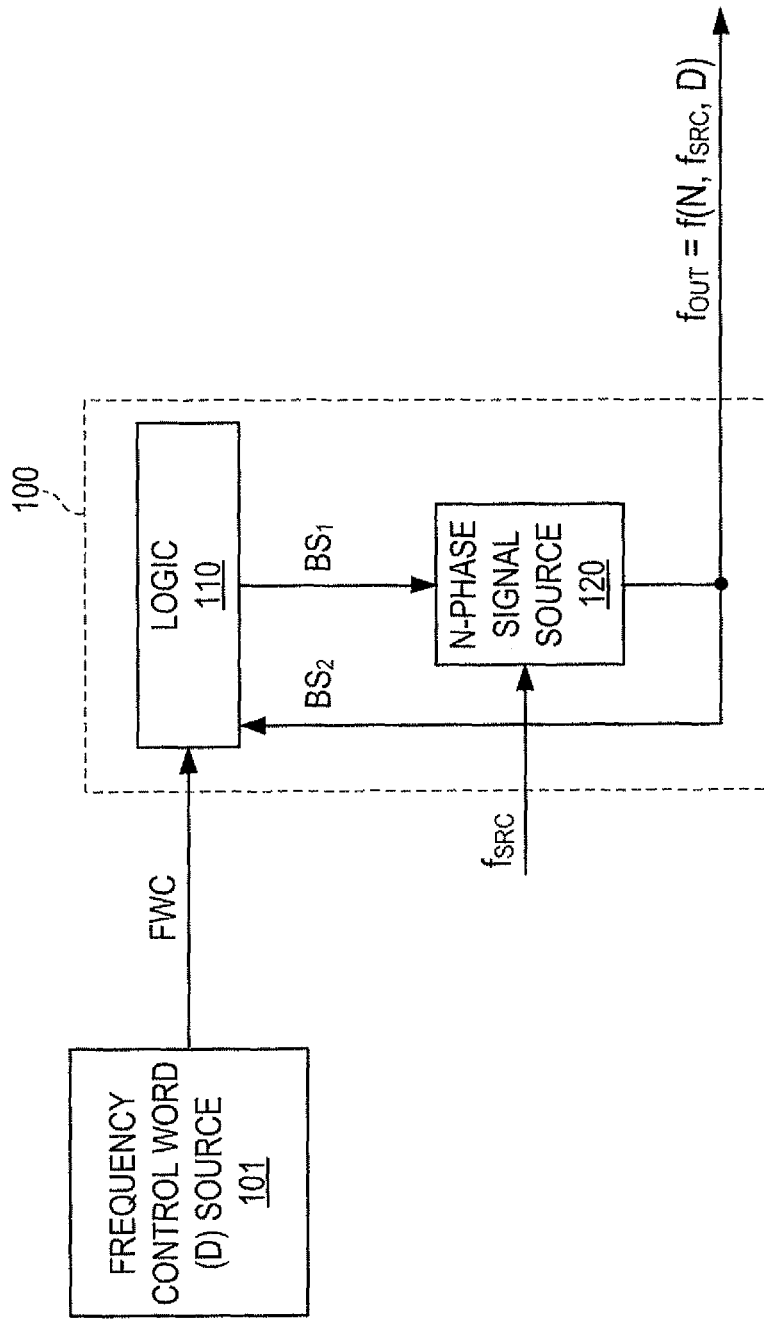
FIG. 1 shows an exemplary block diagram of a variable digital frequency divider 100 according to an embodiment of the disclosure.

FIG. 1 is an exemplary block diagram of a variable frequency divider 100 according to an embodiment. As shown in FIG. 1, the variable frequency divider 100 includes logic 110 and an N-phase signal source 120. A frequency control word source 101 supplies data, such as a frequency control word (FCW), to a control input port of the logic 110. The signal output port of logic 110 is coupled to a signal select input port of the N-phase signal source 120, and a signal output port of the N-phase signal source 120 is coupled to a signal input port of logic 110, such that logic 110 and the N-phase signal source 120 form a feedback control loop. Data lines can connect the frequency control word source 101, logic 110, and the N-phase signal source 120. The variable frequency divider 100 also receives an input signal of a source frequency $f_{src}$ at a control port of the N-phase signal source 120, as shown. The output of the variable frequency divider 100 is a signal, $f_{out}$, of the N-phase signal source 120.

In general, the variable frequency divider 100 may be any device that includes a signal source configured to generate a clock pulse corresponding to an input value, and a logic unit that is configured to transmit a next input value to the signal source in response to the clock pulse, where the next input value is based on the input value and the frequency control word.

The frequency control word source 101 can be any device that generates a frequency control word FCW. For example, frequency control word source 101 may generate a hexadecimal string representing a desired output frequency $f_{out}$ to be generated by the variable frequency divider 100. Preferably, as will be described later, FCW may represent an offset value to be added to the current signal address. In an embodiment, $f_{out}$ is a function of an integer D whose value is implicitly or explicitly represented in the frequency control word FCW. Accordingly, the frequency control word source 101 may be equivalently considered to be a "D" source, as illustrated in FIG. 1.

Logic 110 may be any suitable configuration of hardware and/or software capable of taking the frequency control word FCW from the frequency control word source 101 and an input clock signal bit stream $BS_2$, and generating a suitable instruction bit stream $BS_1$, based on the frequency control word FCW and the input bit stream $BS_2$. The instruction bit stream $BS_1$ can be input into the signal input port of the N-phase signal source 120. In practice, $BS_1$ may be an instruction to the N phase signal source 120 to select and output the next signal $BS_2$ in a sequence represented by the frequency control word FCW.

The N-phase signal source 120 may be any device capable of selectively outputting one or more clock signal bit streams. Each clock signal bit stream is one of N phase-delayed copies of the input signal of the source frequency $f_{src}$. In an embodiment, the N-phase signal source 120 accomplishes this task by applying $f_{src}$ to a series-connected chain of N inverters, each of which imparts a delay of $(360/N)°$ in phase. The outputs of each inverter are then connected to addressable outputs of a multiplexer (MUX).

The output frequency of the variable frequency divider 100 $f_{out}$ can be determined by the source frequency $f_{src}$, the frequency control word FCW (or, equivalently, D), and the integer N, which is a property of the hardware implementation of the variable frequency divider 100. In an embodiment, N is the integer specifying the number of phase delayed selectable signals of the N-phase signal source 120. The frequency control word FCW can represent a sequence in which a subset of the selectable clock signal bit streams from the N-phase signal source 120 are applied to the output of the variable frequency divider 100. In a preferred embodiment, N=64.

In operation, the frequency control word source 101 first generates the frequency control word FCW to be transmitted to logic 110. The frequency control word FCW and a first input clock signal bit stream $BS_2$ are then applied to the control and signal input ports of logic 110, respectively. Logic 110 then calculates a next input value, or third clock signal bit stream during the first pulse of the first (current) clock signal bit stream $BS_2$. At the end of the first pulse of the first (current) clock signal bit stream $BS_2$, logic 110 selects the input value, or second (next) clock signal bit stream $BS_2$ in the sequence, and transmits an instruction $BS_1$ to generate the input value, or second (next) clock signal bit stream $BS_2$. Hence, the progressive selection of each new signal $BS_2$ (from the series represented by FCW) results from a previous operation performed on FCW and the previous signal $BS_2$.

During this process, each newly selected signal from the N-phase signal source 120 (new signal $BS_2$) can be selected during the falling edge of the previous signal (previous $BS_2$). That is, each subsequent signal is applied immediately following the first pulse of the previous signal $BS_2$. Accordingly, each signal $BS_2$ contributes only a "pre-pulse" phase delay followed by a pulse to the resulting output signal. Following the pulse, the previous signal $BS_2$ is immediately truncated by the application of a new signal $BS_2$. The accumulation of pulses and "pre-pulse" delays at the output, suitably spaced (or, equivalently, timed), define a new signal with a characteristic frequency. This frequency is the variable frequency divider output frequency $f_{out}$. Because this process is based on iteratively calculating and selecting bit streams, it constitutes a digital feedback loop between logic 110 and the N-phase signal source 120.

Figure 2:
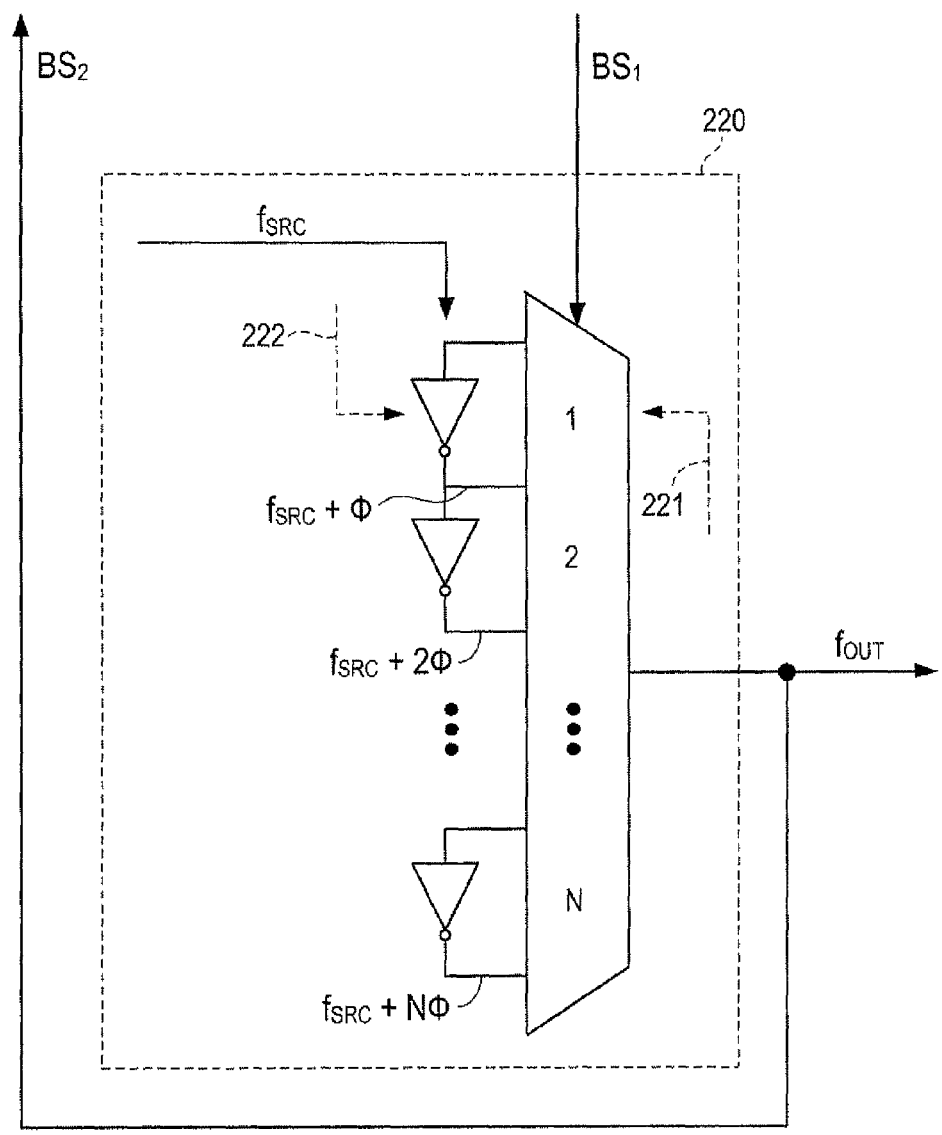
FIG. 2 shows an exemplary block diagram of a multiphase (N-phase) signal source 220 according to an embodiment of the disclosure.

FIG. 2 shows an N-phase signal source 220 in greater detail. The N-phase signal source 220 includes a multiplexer 221 and multiple N series-connected inverters 222. As shown in FIG. 2, each inverter output can be phase delayed by an amount φ relative to its closest neighbors due to the inverter chain, where φ=360°/N. Each output is also separately addressed. As described above, the instruction bit stream $BS_1$ can be iteratively determined by logic 110. In general, $BS_1$ is any instruction to the N-phase signal source 220 to output the updated signal $BS_2$. In a preferred embodiment, $BS_1$ is simply the address of the next signal requested from the multiplexer 221, and N=64.

An example of a sequence represented by the frequency control word FCW could be a sequence in which the $32^{nd}$ signal and the $64^{th}$ signal are alternately applied to the output. This sequence turns out to be one way of synthesizing $f_{out}=2*f_{src}$, since 2 cycles are selected over a single period of $f_{src}$, the $32^{nd}$ and the $64^{th}$. Assuming that the phase delay elements (inverters) are addressed from 1-64, or equivalently 000000 to 111111 (0-63) in binary, this requires $BS_1=\{011111, 111111\}=\{31, 63\}$ where brackets denote the sequence. This is one example of a sequence for the N-phase signal source 220 that generates the correct output signals in the proper order. In more elaborate sequences, $BS_1$ might take on a larger plurality of values such as $\{8, 16, 24, 32 \dots\}$ (8 distinct address values) or even $\{1, 2, 3 \dots N\}$ (N=64, 64 distinct address values). These are some of the possible sequences that may be requested from the N-phase signal source 220 by logic 110.

Figure 3:
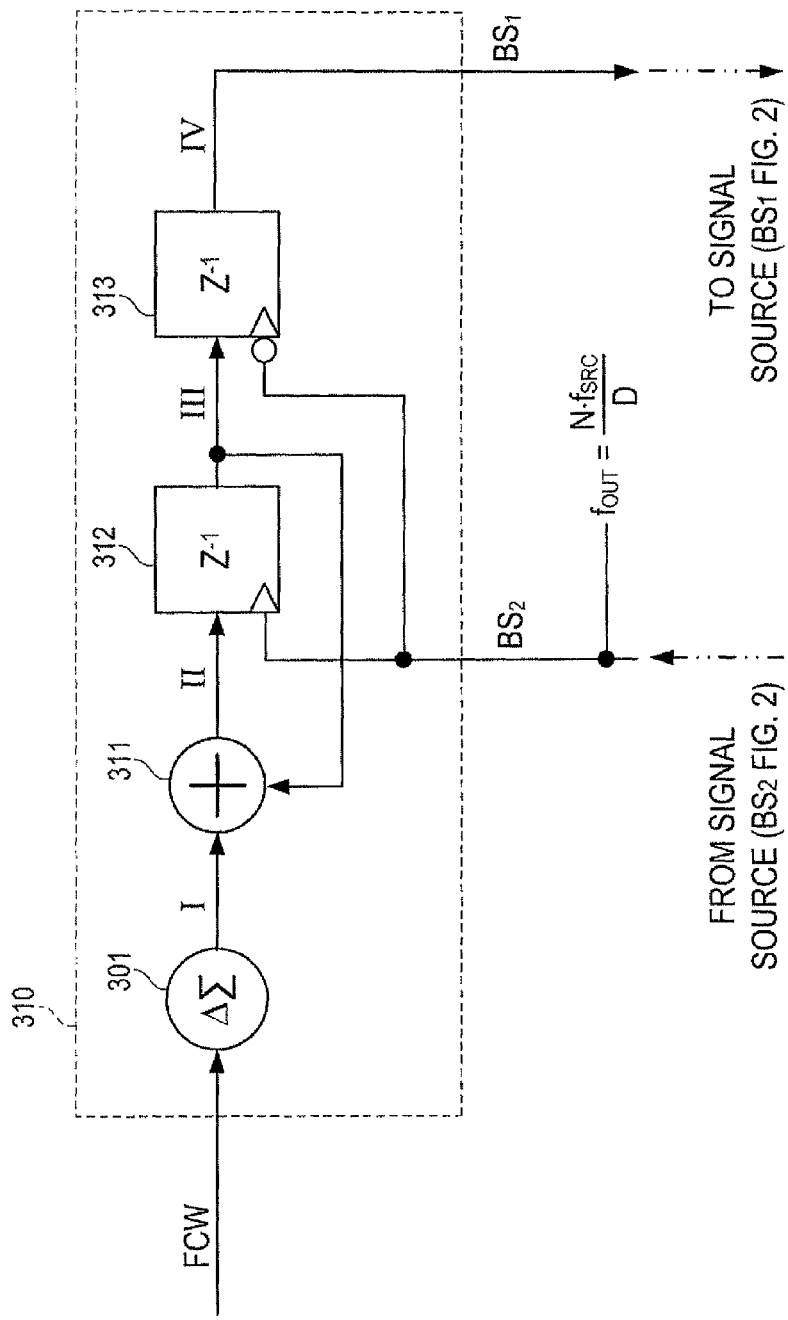
FIG. 3 shows an exemplary block diagram of a logic 310 according to an embodiment of the disclosure.

FIG. 3 shows an exemplary logic 310 in greater detail. Logic 310 includes a summing unit 311, a second unit (or positive edge triggered unit delay block) 312, and a first unit (or negative edge triggered unit delay block) 313. Logic 310 also optionally includes a delta-sigma modulator 301. In an embodiment the unit delay blocks are simple flip-flops.

The function of logic 310 is to perform two operations during a single pulse of the current (or "first") clock signal. The first operation is to calculate a next input value, or "third" clock signal, and store this value in the second unit (positive edge triggered flip-flop) 312. This is called the "third" signal because it will be the third input relative to the current input, which is arbitrarily called the "first" clock signal. Next, logic 310 should select a (new) input value, or "second" clock signal, during the falling edge of the first pulse of the first clock signal. This signal will immediately become the current input value to logic 310 once selected. Accordingly, logic 310 calculates and selects its own next input(s) (or, equivalently, the next output(s) $BS_2$ of the N-phase signal source 220) as just described. Thus, immediately following a given pulse from any signal $BS_2$, the next signal will have been selected, and the new next signal will have been calculated and temporarily stored in the positive edge triggered flip-flop.

The instruction(s) to generate the input value (second) clock signals are iteratively issued as instruction bit streams $BS_1$ to the N-phase signal source 220, which generates the input value (second) clock signal $BS_2$ upon completion the of each first clock pulse from the previous $BS_2$.

A feature of logic 310 that permits this functionality is that the incoming bit stream signal $BS_2$ is tied to both the positive-edge unit delay 312 trigger and the negative-edge unit delay 313 trigger. Thus, unlike many generic sequential logic circuits which perform a single operation per cycle (per clock pulse), a single pulse by bit stream $BS_2$ is sufficient to execute two operations: a first operation on the positive (rising) edge of $BS_2$ owing to the positive-edge triggered unit delay element 312, and a second operation on the negative (falling) edge of $BS_2$ owing to the negative-edge triggered unit delay element 313.

The operation of logic 310 will now be described in greater detail, and will refer to logic nodes I-IV in FIG. 3. Signals $BS_2(0)$ through $BS_2(3)$ denote the sequence of signals applied to logic 310 at times t=0 through t=3. Because logic 310 is a sequential logic circuit, its output depends on previous inputs. Accordingly, for this example it is assumed that the first signal $BS_2(0)$ has already occurred, resulting in a calculation, performed by the summing unit 311 on $BS_2(0)$ and FCW, the result of which is the address of the signal $BS_2(2)$. That is, prior to the arrival of signal $BS_2(1)$ at logic 310, the address of $BS_2(2)$ is already waiting (or stored) at logic node II.

At the start of operation, the positive edge of signal $BS_2(1)$ activates the positive-edge triggered unit delay element 312, passing the address of signal $BS_2(2)$ from node II to node III. Following the positive edge of $BS_2(1)$, but before the negative edge (i.e., during the pulse), the address of $BS_2(2)$ at node III is also fed back to summing unit 311, where it is combined with FCW to produce the address of signal $BS_2(3)$, which is now stored at node II. At the end of the pulse from signal $BS_2(1)$, the falling-edge pulse from signal $BS_2(1)$ activates the negative-edge triggered unit delay element 313, and the address of $BS_2(2)$ is passed from node III to node IV, and thus to the N-phase signal source 220 as $BS_1$. This instruction causes the N-phase signal source 220 to generate the next signal, $BS_2(2)$. As before, prior to the arrival of $BS_2(2)$ at logic 310, the value of the address of $BS_2(3)$ is already stored at node II. At the end of the iteration, as described, the system is in essentially the same state as at the beginning of operation, and ready to repeat the process again ad infinitum.

In the preceding description, it may be necessary or desirable to modify the duty cycle of the source frequency $f_{src}$ at the control port of the N-phase signal source 120 to permit for a longer amount of time following the falling edge of $BS_2(1)$ (and thus $f_{src}$). That is, it may be advantageous to prolong the occurrence of the rising edge of $BS_2(2)$ to allow the multiplexer 221 an extended period of time in which to apply BS2(2) to the input of logic 310. In this circumstance, a simple duty cycle "transfer" loop 410 as illustrated in FIGS. 4A and 4D could suffice to generate a new $f_{src}$ frequency $f_{srcNEW}$ with a smaller (or even larger) duty cycle.

Figure 4A:
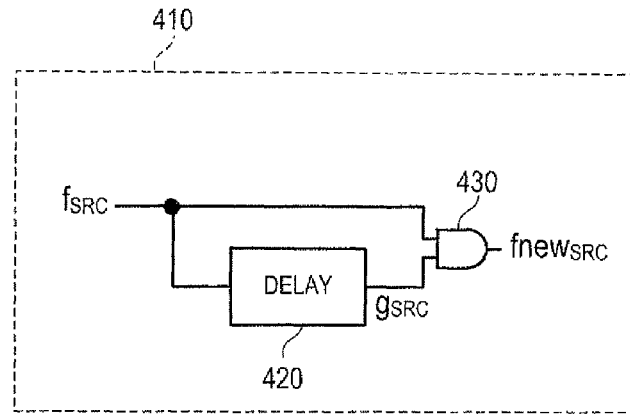
FIGS. 4A-4C show an exemplary block diagram for a duty cycle transfer loop 410 with a delay circuit 420 and an active logic element AND gate 430, and the inputs and outputs of the duty cycle transfer loop 410 with inputs of 50% and 25% duty cycle, respectively.
Figure 4B:
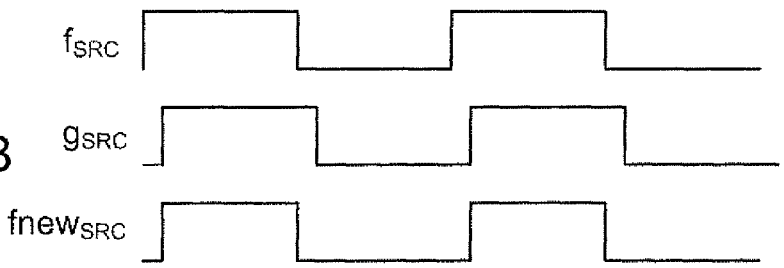
Figure 4C:
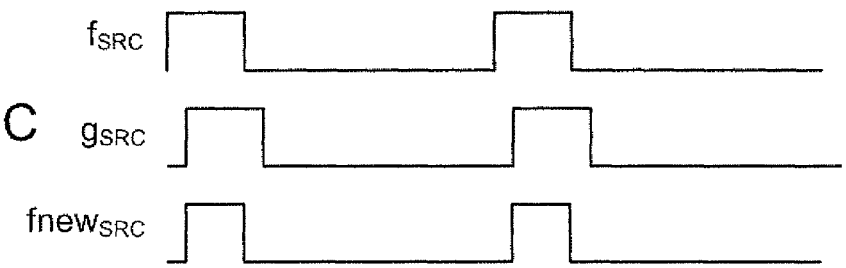
Figure 4D:
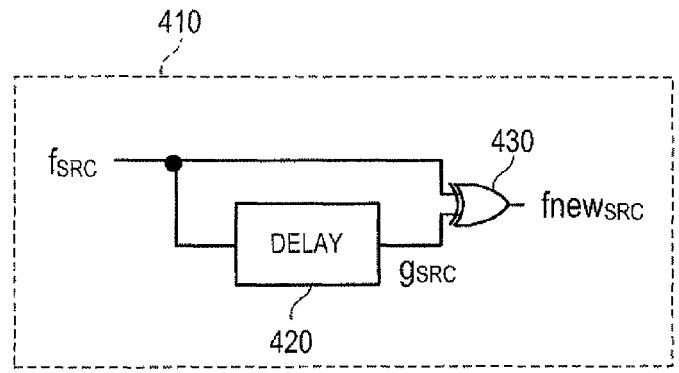
FIGS. 4D-4E show an exemplary block diagram for a duty cycle transfer loop 410 with a delay circuit 420 and an active logic element XOR gate 430, and the inputs and outputs of duty cycle transfer loop 410 with an input of 50% duty cycle.
Figure 4E:
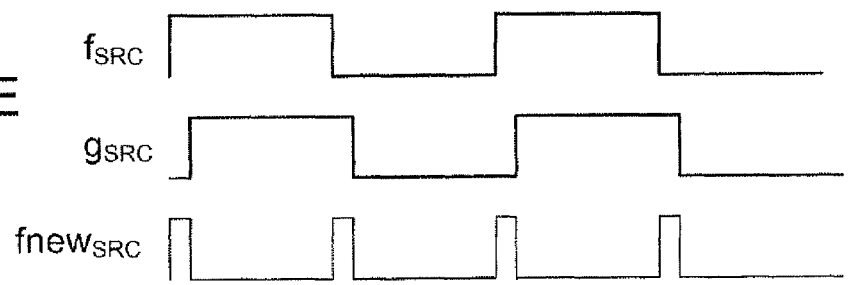

As will be familiar to those of skill in the art, the duty cycle transfer loop 410 creates a delayed copy of $f_{src}$, denoted in FIGS. 4A and 4D as $g_{src}$, by applying $f_{scr}$ to a delay circuit 420 to generate $g_{src}$. The delay circuit 420 may be any circuit suitable for imparting a delay on $f_{src}$, such as an inverter chain. Both $f_{src}$ and $g_{src}$ may then be simultaneously applied to a logic circuit 430 such as an AND gate (FIG. 4A) or an XOR gate (FIG. 4D) to create the desired outputs. FIGS. 4B-C and 4E illustrate the respective input and output signals from the duty cycle transfer loop 410.

In the above example, the signals $BS_2(t)$ are ultimately responsible for "building" the output signal $f_{out}$ taken from the output of the N-phase signal source 220 (or, equivalently, taken from the input to logic 310), as further described below. The signals $BS_2(t)$ are also responsible for keeping the timing of the system synchronized. The frequency control word FCW, on the other hand, has no timing or synchronization component. It is simply a static list (or value) that contributes the appropriate bit string to the summing unit 311 which, when calculated with the signals $BS_2(t)$, produce the address of the signal after next $BS_2(t+2)$ (t+2 because the third clock signal is calculated, not the second which would be t+1; note in the above example FCW and $BS_2(\underline{0})$ produced the address for signal $BS_2(\underline{2})$, and FCW and $BS_2(\underline{1})$ produced the address for signal $BS_2(\underline{3})$). Thus, FCW may be thought of as a simple list (i.e., sequence) of addresses to be sequentially applied to the output.

As previously discussed, the pulses from signals $BS_2(t)$ are concatenated over time at the output because only the phase delay before the pulse, followed by the pulse, are added to the output signal. This process is made possible by the positive-edge triggered and negative-edge triggered unit delay elements 312 and 313, which perform a signal-after-next address calculation on the positive edge and a next signal selection on the negative edge as described above. Thus, at the end of a previous pulse an updated signal $BS_2(t+1)$ is immediately applied to the output, and whatever further phase delay may have followed the preceding pulse is lost. Accordingly, even though the individual signals each have a frequency $f_{src}$ characterized by the full signal features (a pre-pulse phase delay, followed by a pulse, followed by a post-pulse phase delay), the output frequency may be much higher, owing to the truncation of the post-pulse phase delay in favor of a rapid succession of (pre-pulse delay+pulse) phase delayed copies of $f_{src}$. This may result in a pulse train with a net frequency much higher than $f_{src}$ as further described below.

An illustrative alternative to describing $f_{out}$ as a function of $BS_2(t)$ (i.e., as a function of time) is to instead define $BS_2(\phi)$ where $\phi$ is some phase angle between 0° and 360°. In particular, $\phi$ denotes the phase angle (i.e., the point in the cycle of $f_{src}$) at which the pulse occurs. In an embodiment, N=64, which implies that each consecutive signal from the N-phase signal source has a pulse occurring 360°/64=5.625° behind the previous pulse. Accordingly, the only available signals from the N-phase signal source are multiples of this fundamental phase angle. Thus, for an arbitrary $BS_2(\phi)$, the values may be $BS_2(5.625°), BS_2(11.25°) \ldots BS_2(n*5.625°)$ where n is an integer between 1 and 64. Accordingly, $BS_2(\phi)$ may be more suggestively written as $BS_2(\phi_n)$, more clearly indicating that $\phi$ is a function of n.

It is worth noting that this relationship implicitly requires the pulses from signals $BS_2(\phi_n)$ to each have pulse widths less than the minimum amount of phase angle between neighboring signals, which is 5.625°. This is a suitable assumption for the following examples, but as described later, may not always be the case. For instance, a pulse with a width (i.e., an electrical length) of 90° (or, equivalently, a 25% duty cycle) that starts at $\phi=5.625°$ will end at $\phi=95.625°$. The next signal $BS_2(\phi_{next})$ cannot be any of the phase values $\phi_1$ through $\phi_{17}$, since they each begin before the falling edge of the previous signal. The next available signal is $\phi_{18}$, or $BS_2(101.25°)$. Thus, as signal pulses become wider, the maximum possible output frequency is lowered.

Examples of the selection of signals $BS_2(\phi_n)$ in sequence according to FCW will now be described. A first possible desired output frequency from the variable frequency divider 100 may be the lowest possible output frequency. Assume the N-phase signal source is arbitrarily outputting a signal $BS_2$ (135°) (n=24). To generate the lowest possible frequency, a next signal $BS_2(\phi_n)$ can be chosen so as to have the longest possible delay until the next pulse.

However, by inspection it should be immediately obvious that this entails "re-selecting" the address of the same signal, $BS_2(135°)$. It can be demonstrated that every other signal, from n=25 to n=64, and then restarting from n=1 to n=23, will have a pulse before the same signal would. Accordingly, it has been determined that the lowest possible frequency output from the variable frequency divider 100 is:

$$f_{out,\,min=fsrc} \qquad \text{Eq. (1)}$$

To represent this single-signal "sequence," FCW could be encoded to simply be the address of this n=24 signal. In binary (where n is taken from 0-63) this would be FCW=0010111, in hex FCW=0017. However, a preferable way of representing FCW may be as a value that can be added to the current address, since the signal at n=24 is the same signal as n=(24+64) using modulo addition. This is a more efficient means of representing an arithmetic progression (equally spaced sequence) of values (addresses), since no matter how many addresses/sequence elements are necessary to generate an output, the distance between them remains constant.

As a second example, the desired output frequency may be the highest possible output frequency from the variable frequency divider 100. In this scenario, the very next signal $BS_2(\phi_n)$ can be selected which has the minimum amount of phase delay between the end of the previous pulse and the occurrence of the next. By inspection, it is clear that $BS_2(\phi_{next})$ from a signal $BS_2(\phi_n)$ is $BS_2(\phi_{n+1})$ for a maximum possible output frequency. That is, for a given signal $BS_2$ (112.5°) (n=20), the shortest delay until the next signal will occur by selecting $BS_2$(118.125°) (n=21). Likewise, the next signal following this signal should be n=22, and so on.

From the above example, it should be clear that, by selecting consecutive signals $BS_2(\phi_n)$ where n is continually incremented by 1, the output frequency will exhibit pulses at each value of n. That is, over a single period (0° to 360°), there will be pulses at 5.625°, 11.25° . . . through 360°. Since n ranges from 1 to N, there will be N total pulses over a single period of $f_{src}$, or mathematically:

$$f_{out,max} = N * f_{src} \qquad \text{Eq. (2)}$$

This is the maximum output from the variable frequency divider 100.

As previously described, there are numerous ways of representing (encoding) this (or any) sequence in FCW which, when combined with suitable decoding circuitry, would result in some operation acting on FCW and $BS_2$: O(FCW, $BS_2$) =$BS_1$ in which $BS_1$ would repetitively alternates between the 64 possible address values. It may be encoded as the cyclically repeating addresses of each signal, i.e., FCW= . . . 0504030201003F3E3D . . . in hex. A second possibility is to encode FCW to explicitly specify state transitions. This encoding scheme is often referred to as non-return to zero (NRZ), and indicates a state change 0→1 and 1→0 with a "1," no state change (hold at "1" or "0") as a zero. For consecutive pulses as described in the above example with equal "on" and "off" times within a given n, this may be represented (in binary) as FCW=101000101000 . . . .

However, the preferred means of encoding FCW, as previously discussed, is as a binary offset value added to the address of the current signal. As shown in FIG. 3, this value, added to the address value at node III, would always yield the correct address to be transmitted to the N-phase signal source 220, and would automatically perform the necessary modulo addition.

For example, suppose a desired output frequency of $f_{out}=4*f_{src}$ is to be produced (and N=64). This frequency will be generated if 4 equally spaced pulses occur during one cycle of $f_{src}$. This, in turn, will occur if the signals are spaced 64/4=16 signals apart from each other. Accordingly, FCW=16 (decimal)=010000 (binary). This frequency will be generated (arbitrarily) by the following sequence of addresses: {16, 32, 48, 64, 16 . . . }. In binary, this is {010000, 100000, 110000, 000000, 010000 . . . }.

Referring again to FIG. 3, the following convention of signal→address will now be used. As in the previous example, it is assumed the value of the second signal $BS_2(2)$ →100000 is already stored in node II from the previous pulse $BS_2(0)$→000000, before the arrival of the first pulse $BS_2(1)$ →010000. Upon the arrival of the positive pulse edge from $BS_2(1)$→010000, $BS_2(2)$→100000 is moved from node II to node III. During the pulse, $BS_2(2)$ is added to FCW at summing unit 312. That is, $BS_2(2)$→100000+FCW (010000) =$BS_2(3)$→110000 is now stored at node II. Upon the negative edge of the pulse from $BS_2(1)$→010000, signal $BS_2(2)$ →100000 moves from node III to node IV, and is sent to the N-phase signal source 220, which generates $BS_2(2)$→100000 as an input. As before, prior to $BS_2(2)$→100000 arriving at logic 310, signal $BS_2(3)$→110000 is already at node II.

It is worth noting that, during this next iteration, signal $BS_2(3)$→110000 will be added to FCW (010000) to yield $BS_2(3)$→110000+FCW (010000)=$BS_2(4)$→<u>1</u>000000. However, since only 6 bits of space are provided, the <u>1</u> is dropped, and thus $BS_2(4)$→000000 (the sequence wraps around as required).

By following the process outlined above, the variable frequency divider 100 may be used to generate any number of frequencies between $f_{src}$ and $N*f_{src}$ depending on the sequence of signals specified by FCW. A convenient means of expressing this relationship is as follows:

$$f_{out}=N*f_{src}/D \qquad (3)$$

From equation (3), it should be clear that the minimum and maximum output frequencies from equations (1) and (2) occur with D=N and D=1, respectively. Of course, it should also be clear from the above discussion that $f_{out}$ may also take on any of the remaining values of D=2, . . . N−1. In particular, if FCW is encoded as an offset value added to the address of a previously applied signal $BS_2$ as described above, then FCW simply is D (in binary). For example, for an output frequency $f_{out}=16*f_{src}$, $N*f_{src}/D=(64/4)*f_{src}$, and thus D=FCW=4 (decimal)=0100 (binary). This value of FCW is all that is required to generate the desired output frequency.

As previously noted, a benefit of employing integer division on a given frequency is that the phase noise of the signal being divided, in this case $N*f_{src}$, is reduced by 20 Log(D).

As previously noted, D is determined by the frequency control word FCW, but the duty cycle of $f_{src}$ places a lower limit on the value of D that may be achieved in practice. It can be easily shown that the duty cycle and D satisfy the inequality:

$$N*\text{Duty Cycle } (\%) < [D]_{D=an\ integer} \qquad \text{Eq. (4)}$$

Hence, for a duty cycle of 25%, the minimum value of D=17. Preferably, D is chosen to be some value comfortably beyond this limit, such as D=24.

A further property of variable frequency divider 100 is that it is capable of emulating non-integer values of D (via FCW) by time-averaging full integer values. For example, D may be approximated at a value of 30.02 by setting D=30 for 49 cycles and D=31 for 1 cycle. This information may be contained entirely in a single FCW or may be communicated by consecutively transmitting differing FCW's, each representing a single value of D. The ability to emulate fractions of a value makes variable frequency divider 100 a fractional variable frequency divider.

As previously stated, a preferred application of the variable digital frequency divider disclosed above is as the central synthesis component of a digital frequency synthesizer with added emphasis on low phase-noise frequency generation (i.e., the source frequency signal). An example of such a preferred digital frequency synthesizer embodiment is described in U.S. patent application Ser. No. 13/875,829, filed on May 2, 2013, entitled "A METHOD AND APPARATUS FOR SYNTHESIZING A LOW PHASE NOISE FREQUENCY WITH WIDE TUNING RANGE", which is hereby incorporated herein by reference in its entirety.

FIG. 5 shows a simplified example of a possible sequence for a variable frequency divider 100 with N=12 and D=8. In this example, the frequency of $f_{src}=4$ Hz (or, more appropriately, 4 cycles over the course of FIG. 5). That is, for a given phase-delayed signal ph_1, FIG. 5 shows 4 iterations of the repeating cycle (1, 0). The duty cycle of each signal ph_0 through ph_11 is 50% (equal "on" and "off" pulse time). From this information, eq. (4) predicts D>6, which is true. Further, eq. (3) predicts the output frequency $f_{out}=N*f_{src}/D=12*4/8=6$ Hz, which is also true because there are 6 iterations of the cycle (1,0) of $f_{out}$ shown at the top of FIG. 5.

More importantly, FIG. 5 illustrates the iterative process in which each next input value (third clock signal) is calculated during a first pulse of each current (first) clock signal, and each input value (second clock signal) is selected in response to the falling edge of the first pulse of each current (first) clock signal.

For example, beginning with signal ph_0 at the top left of FIG. 5, it can be seen from the arrows that the input value (second clock signal) will be the signal ph_8, and the next input value (third clock signal) will be ph_4 (after which the sequence repeats). As illustrated in FIG. 5, the rising edge of ph_0 triggers the calculation of the next input value (third clock signal). In FIG. 5, this is indicated as "CALC EDGE=ph_4," and occurs during the first pulse of ph_0. As indicated, this calculation results in the calculation of signal ph_4 as the next input value (third clock signal), which is correct according to FIG. 5. Next, in response to the falling edge of the current (first) clock signal ph_0, the input value (second clock signal) is selected. This process is indicated in FIG. 5 by "SELECT EDGE=ph_8." As indicated, the result of this selection process is the selection of the input value (second clock signal), which is ph_8. This is also correct according to FIG. 5. The entire process then repeats. Now, signal ph_8 is the current (first) clock signal, ph_4 is the input value (second clock signal), and ph_0 is the next input value (third clock signal).

Accordingly, the circuit producing the output $f_{out}$ of FIG. 5 is an exemplary example of a variable frequency divider configured to generate a clock pulse corresponding to an input value from a signal source, generate a next input value is based on an input value and the frequency control word by a logic unit, and transmit the next input value from the logic unit to the signal source in response to the clock pulse.

Finally, FIG. 5 provides an intuitive example of how a signal duty cycle (in this case 50%) may begin to encroach on the possible output frequencies available from the variable frequency divider 100. Because of this effect, it is important to restrict a clock signal duty cycle to no more than 50%, and preferably 25%.

Figure 6:
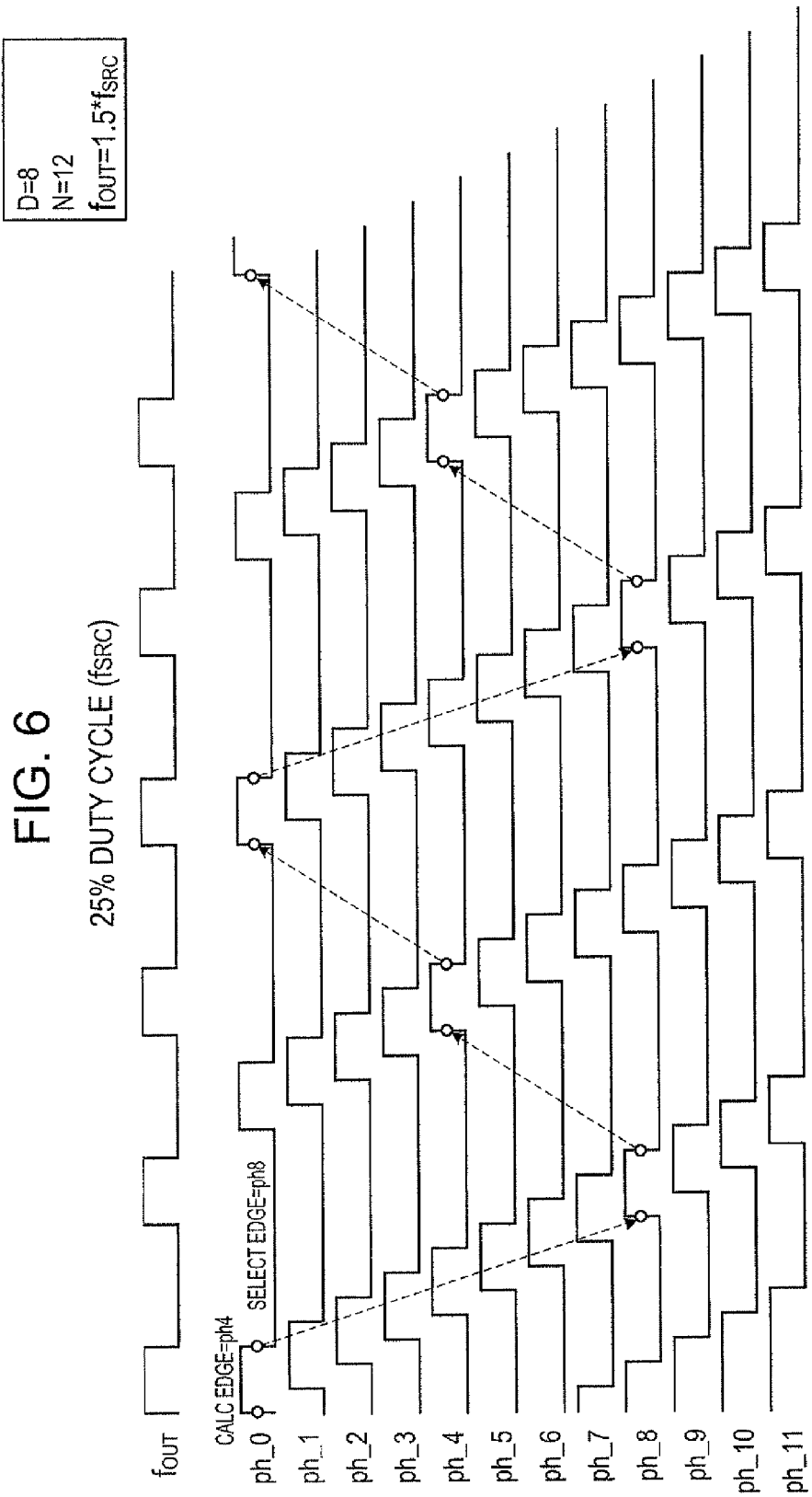
FIG. 6 shows a diagram of an exemplary process of signal selection and output from a variable frequency divider 100 with a 25% duty cycle according to an embodiment of the disclosure.

FIG. 6 illustrates a variable frequency divider 100 according to a preferred embodiment of the present invention. FIG. 6 illustrates the same exact process as in FIG. 5, but now with the preferred 25% duty cycle. Accordingly, D, and hence FCW, are each still 8 (as may be deduced by the signal spacing), but now they are more comfortably removed from the minimum value of 25%*12=3<D, implying $D_{min}$=4.

Figure 7:
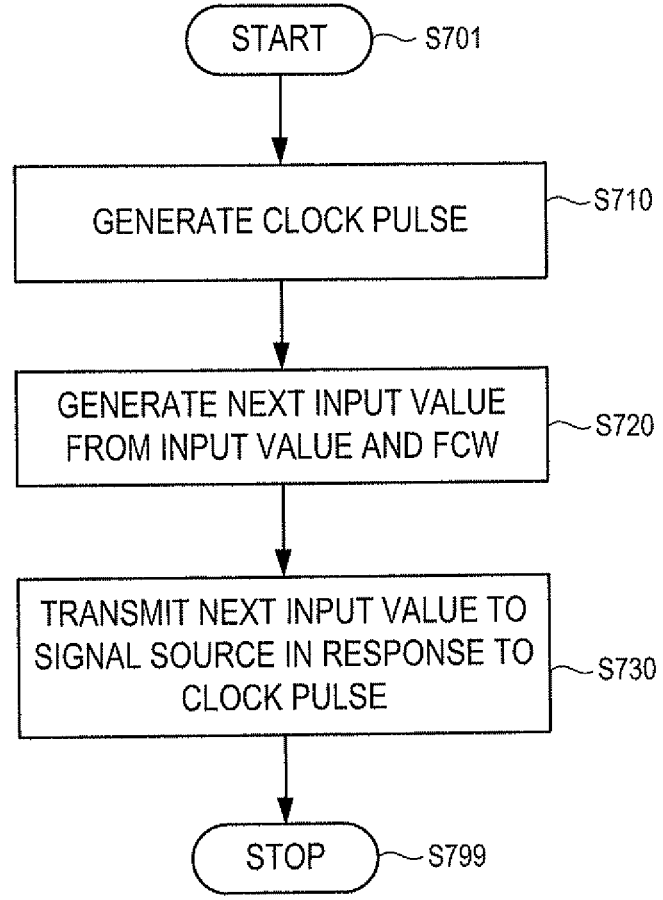
FIG. 7 shows a flow chart of an exemplary digital frequency division method according to an embodiment of the disclosure.

FIG. 7 is a flowchart outlining an exemplary variable frequency dividing process 600. The process begins at step S701 and proceeds to step S710, where a clock pulse is generated by the signal source 220, which corresponds to an input value from a logic unit 110. The clock pulse becomes the current input to the logic unit 110.

In step S720, a next input value is generated by the logic unit 110 based on the input value stored in the first unit (negative edge triggered flip-flop) 313 and an externally supplied frequency control word. The next input value is stored in the second unit (positive edge triggered flip-flop) 312.

In step S730, the next input value is transmitted from the logic unit 110 to the signal source in response to the current clock pulse. The signal source 220 then generates the appropriate updated clock pulse.

Control then passes to S799, where the current iteration ends. The variable frequency divider 100 is now ready to begin a new iteration, processing the next signal in the series required to generate the desired output frequency $f_{out}$.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A variable frequency divider, comprising:
   a signal source configured to generate a clock pulse corresponding to an input value;
   a logic unit that is configured to transmit a next input value to the signal source in response to the clock pulse, where the next input value is based on the input value and a frequency control word;
   a first unit and a second unit that store the input value and the next input value, respectively, the second unit being coupled to the first unit so that the next input value can be transmitted to the first unit to become the input value, wherein the first unit is a falling-edge triggered flip-flop, and the second unit is a rising-edge triggered flip-flop.

2. The variable frequency divider as recited in claim 1, further comprising:
   a summing unit that is coupled between the first unit and the second unit, the summing unit being configured to add the frequency control word to the input value and to output the next input value to the second unit.

3. The variable frequency divider as recited in claim 1, wherein the first unit and the second unit receive the clock pulse from the signal source.

4. The variable frequency divider as recited in claim 1, wherein the clock pulse includes a rising edge and a falling edge, so that in response to the rising edge of the clock pulse, the input value in the first unit becomes the next input value and the next input value of the second unit becomes the next input value combined with the frequency control word, and in response to the falling edge, the input value of the first unit is transmitted to the signal source.

5. The variable frequency divider as recited in claim 1, wherein the signal source further includes:
   a multiplexer that selects one of a plurality of phase-delayed clock pulses based on the input value received from the logic unit and outputs the selected phase-delayed clock pulse.

6. The variable frequency divider as recited in claim 5, wherein the output of the multiplexer is the clock pulse of the signal source.

7. The variable frequency divider as recited in claim 5, wherein the output of the multiplexor is the output of the variable frequency divider $f_{out}$ having a frequency equal to a clock pulse frequency $f_{src}$ multiplied by a number of phase-delayed clock pulses N and divided by an integer D represented by the frequency control word, or $f_{out}=N*f_{src}/D$.

8. The variable frequency divider as recited in claim 5, wherein the plurality of phase-delayed clock pulses are generated by passing an initial clock pulse signal of frequency $f_{src}$ through a series connected chain of N phase-delay elements.

9. A method of performing variable frequency division, comprising:
   generating a clock pulse corresponding to an input value;
   calculating a next input value based on the input value and a frequency control word;
   generating a next clock pulse corresponding to the next input value;
   storing the input value in a first unit and the next input value in a second unit, wherein the first and second units are coupled to each other;

transmitting the next input value to the first unit to become the input value;
overwriting the input value in the first unit with the next input value from the second unit in response to a rising edge of the clock pulse;
overwriting the next input value from the second unit with the next input value combined with the frequency control word in response to the rising edge of the clock pulse; and
transmitting the input value of the first unit to a signal source in response to a falling edge of the clock pulse.

10. The method of claim 9, further comprising:
summing the frequency control word and the input value in a summing unit coupled between the first unit and the second unit,
transmitting the sum of the frequency control word and the input value to the second unit as the next input value.

11. The method of claim 10, further comprising:
receiving the clock pulse from a signal source at both the first unit and the second unit.

12. The method of claim 9, further comprising:
selecting one of a plurality of phase-delayed clock pulses based on the input value; and
outputting the selected phase-delayed clock pulse.

13. The method of claim 12, further comprising:
iteratively outputting a series of selected phase-delayed clock pulses to generate a signal $f_{out}$ having a frequency equal to a clock pulse frequency $f_{src}$ multiplied by the number of phase-delayed clock pulses N and divided by an integer D represented by the frequency control word, or $f_{out}=N*f_{src}/D$.

14. A variable frequency divider, including:
a logic unit that receives a frequency control word and a first clock pulse signal as inputs and outputs an input value, the logic unit comprising:
a first unit delay element which is a rising-edge triggered flip-flop,
a second unit delay element which is a falling-edge triggered flip-flop,
a summing junction that is coupled between the first unit delay element and the second unit delay element, the summing junction being coupled to the frequency control word input, the first unit delay element and the second unit delay element, and
a delta-sigma modulator that is coupled between the frequency control word input and the summing junction; and
a signal source that receives the input value and outputs a second clock pulse signal, the signal source comprising:
a clock pulse signal generator that is configured to generate a plurality of clock pulse signals, and
a multiplexer that is coupled to the clock pulse signal generator and is configured to select a clock pulse signal from the plurality of clock pulse signals in response to the input value, and output the selected clock pulse signal as the second clock pulse signal.

15. The variable frequency divider of claim 14, wherein the clock pulse generator further generates the plurality of clock pulse signals by passing a source frequency signal through a series-connected chain of inverters, and an output of each inverter is connected to a selectable input of the multiplexer.

* * * * *